US009355898B2

(12) United States Patent
Kumar et al.

(10) Patent No.: US 9,355,898 B2
(45) Date of Patent: May 31, 2016

(54) PACKAGE ON PACKAGE (POP) INTEGRATED DEVICE COMPRISING A PLURALITY OF SOLDER RESIST LAYERS

(71) Applicant: QUALCOMM Incorporated, San Diego, CA (US)

(72) Inventors: Rajneesh Kumar, San Diego, CA (US); Houssam Wafic Jomaa, San Diego, CA (US); David Fraser Rae, San Diego, CA (US); Layal Rouhana, San Diego, CA (US); Omar James Bchir, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/447,399

(22) Filed: Jul. 30, 2014

(65) Prior Publication Data

US 2016/0035622 A1   Feb. 4, 2016

(51) Int. Cl.
*H01L 23/48* (2006.01)
*H01L 21/768* (2006.01)
*H01L 23/528* (2006.01)
*H01L 23/532* (2006.01)
*H01L 23/495* (2006.01)
*H01L 21/48* (2006.01)
*H01L 23/498* (2006.01)

(52) U.S. Cl.
CPC ...... *H01L 21/76852* (2013.01); *H01L 21/4825* (2013.01); *H01L 21/76879* (2013.01); *H01L 23/4952* (2013.01); *H01L 23/49527* (2013.01); *H01L 23/49894* (2013.01); *H01L 23/528* (2013.01); *H01L 23/53204* (2013.01); *H01L 23/49816* (2013.01); *H01L 23/49822* (2013.01)

(58) Field of Classification Search
CPC ......... H01L 23/48; H01L 23/52; H01L 29/40; H01L 23/481; H01L 23/488; H01L 2924/01079; H01L 2924/01013
USPC ........................................... 257/738; 174/260
See application file for complete search history.

(56) References Cited

U.S. PATENT DOCUMENTS

| | | | |
|---|---|---|---|
| 6,781,241 B2 | 8/2004 | Nishimura et al. | |
| 7,960,822 B2 * | 6/2011 | Kim | H01L 23/49816 257/686 |
| 8,492,197 B2 | 7/2013 | Cho et al. | |

(Continued)

OTHER PUBLICATIONS

International Search Report and Written Opinion—PCT/US2015/042542—ISA/EPO—Oct. 19, 2015.

*Primary Examiner* — Phuc Dang
(74) *Attorney, Agent, or Firm* — Loza & Loza, LLP

(57) ABSTRACT

Some features pertain to an integrated device that includes a first substrate, a first solder resist layer coupled to the first substrate, a second solder resist layer coupled to the first solder resist layer, and an opening in the first and second solder resist layers, the opening comprising a sidewall completely covered with the second solder resist layer, where a sidewall of the second solder resist layer covers a sidewall of the first solder resist layer. In some implementations, the opening is at least partially filled with an electrically conductive material. The electrically conductive material includes one of solder and/or an interconnect. The integrated device includes a first interconnect coupled to the electrically conductive material. The first interconnect is one of at least a solder, and/or an interconnect ball. In some implementations, the integrated device includes a pad coupled to the substrate, and a first interconnect coupled to the pad.

22 Claims, 15 Drawing Sheets

(56) References Cited

U.S. PATENT DOCUMENTS

| | | |
|---|---|---|
| 8,653,640 B2 | 2/2014 | Kim et al. |
| 2010/0319974 A1* | 12/2010 | Ishizuka .............. H01L 24/81 174/260 |
| 2012/0188735 A1* | 7/2012 | Hiroshima ............. H05K 1/18 361/767 |
| 2012/0247823 A1 | 10/2012 | Kasai et al. |
| 2012/0306075 A1* | 12/2012 | Kim .............. H01L 25/105 257/738 |
| 2014/0054773 A1 | 2/2014 | Kurashima et al. |
| 2014/0069694 A1* | 3/2014 | Cho ............... H05K 3/182 174/251 |
| 2015/0053456 A1* | 2/2015 | Lee ............... H05K 3/3452 174/250 |

* cited by examiner

PACKAGE ON PACKAGE (POP) INTEGRATED DEVICE COMPRISING A PLURALITY OF SOLDER RESIST LAYERS

BACKGROUND

1. Field

Various features relate to a package on package (PoP) integrated device comprising several solder resist layers.

2. Background

FIG. 1 illustrates a conventional package on package (PoP) integrated device. As shown in FIG. 1, the integrated device 100 includes a first package 102 and a second package 104. The first package 102 includes a first substrate 106, a first die (e.g., chip) 108, a first set of solder balls 116, and a first set of interconnects 118. The first substrate 106 may include traces and/or vias (both of which are not shown). The second package 104 includes a second substrate 105, a second die 107, a third die 109, a second set of solder balls 115, a first set of wire bonding 117, and a second set of wire bonding 119. The second substrate 105 may include traces and/or vias (both of which are not shown). The second package 104 is positioned above the first package 102.

The first die 108 is coupled to a first surface (e.g., top surface) of the first substrate 106 through the first set of interconnects 118. The first set of solder balls 116 is coupled to a second surface (e.g., bottom surface) of the first substrate 106. The first substrate 106 includes a set of traces and/or vias that may electrically connect to the first die 108 and/or the first set of solder balls 116.

The second die 107 and the third die 109 are coupled to a first surface (e.g., top surface) of the second substrate 105. The second die 107 is electrically coupled to the traces and/or vias of the second substrate 105 through the first set of wire bonding 117. The third die 109 is electrically coupled to the traces and/or vias of the second substrate 105 through the second set of wire bonding 119. The second set of solder balls 115 is coupled to a second surface (e.g., bottom surface) of the second substrate 105.

One major drawback of the package on package (PoP) configuration shown in FIG. 1 is that it creates an integrated device with a form factor that may be too large for the needs of mobile computing devices. Specifically, the set of solder balls 115 are relatively large and thus cannot provide high density interconnects between packages. This may result in a package that is either too large and/or too thick. That is, the PoP configuration shown in FIG. 1 may be too thick and/or have a surface area that is too large to meet the needs and/or requirements of mobile computing devices.

Therefore, there is a need for an integrated device that includes an improved PoP configuration. Ideally, such an integrated device will have a better form factor (e.g., smaller, thinner) with high density interconnects between packages, while at the same time meeting the needs and/or requirements of mobile computing devices. Moreover, such an improved PoP configuration would provide better integrated device performance (e.g., better signal, better channel, better electrical speed performance).

SUMMARY

Various features, apparatus and methods described herein provide a package on package (PoP) integrated device comprising several solder resist layers.

A first example provides an integrated device that includes a first substrate, a first solder resist layer coupled to the first substrate, a second solder resist layer coupled to the first solder resist layer, and an opening in the first and second solder resist layers. The opening includes a sidewall completely covered with the second solder resist layer. A sidewall of the second solder resist layer covers a sidewall of the first solder resist layer.

According to an aspect, the opening is at least partially filled with an electrically conductive material.

According to one aspect, the electrically conductive material includes one of solder and/or a plated interconnect.

According to an aspect, the integrated device includes a first interconnect coupled to the electrically conductive material.

According to one aspect, the first interconnect is one of at least a solder, and/or an interconnect ball.

According to an aspect, the integrated device includes a pad coupled to the substrate, and a first interconnect coupled to the pad.

According to one aspect, the first interconnect is one of at least a solder, and/or an interconnect ball.

According to an aspect, the integrated device includes a third solder resist layer between the first solder resist layer and the second solder resist layer.

According to one aspect, the integrated device is one of at least a package and/or package on package (POP) device.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a method for fabricating an integrated device. The method forms a first substrate. The method forms a first solder resist layer on the first substrate. The method forms a second solder resist layer on the first solder resist layer. The method forms an opening in the first and second solder resist layers, where the opening is formed such that a sidewall of the opening is completely covered with the second solder resist layer, and where a sidewall of the second solder resist layer covers a sidewall of the first solder resist layer.

According to an aspect, the method forms an electrically conductive material in the opening.

According to one aspect, the electrically conductive material includes one of solder and/or a plated interconnect.

According to an aspect, the method provides a first interconnect on the electrically conductive material.

According to one aspect, the first interconnect is one of at least a solder, and/or an interconnect ball.

According to an aspect, the method forms a pad on the substrate, and provides a first interconnect coupled to the pad.

According to one aspect, where the first interconnect is one of at least a solder, and/or an interconnect ball.

According to an aspect, the method forms a third solder resist layer between the first solder resist layer and the second solder resist layer.

According to one aspect, the integrated device is one of at least a package and/or package on package (POP) device.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides an integrated device that includes a first substrate, a first solder resist layer coupled to the first substrate, a second solder resist layer coupled to the first solder resist layer, and an opening in the first and second solder resist layers, the opening being staggered in the first and second solder resist layers.

According to an aspect, the opening is at least partially filled with an electrically conductive material.

According to one aspect, the electrically conductive material includes one of solder and/or a plated interconnect.

According to an aspect, the integrated device is one of at least a package and/or package on package (POP) device.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a method for fabricating an integrated device. The method forms a first substrate. The method forms a first solder resist layer on the first substrate. The method forms a second solder resist layer on the first solder resist layer. The method forms an opening in the first and second solder resist layers, the opening being staggered in the first and second solder resist layers.

According to an aspect, the method forms an electrically conductive material in the opening.

According to one aspect, the electrically conductive material includes one of solder and/or a plated interconnect.

According to an aspect, the integrated device is one of at least a package and/or package on package (POP) device.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

Figure 12A:
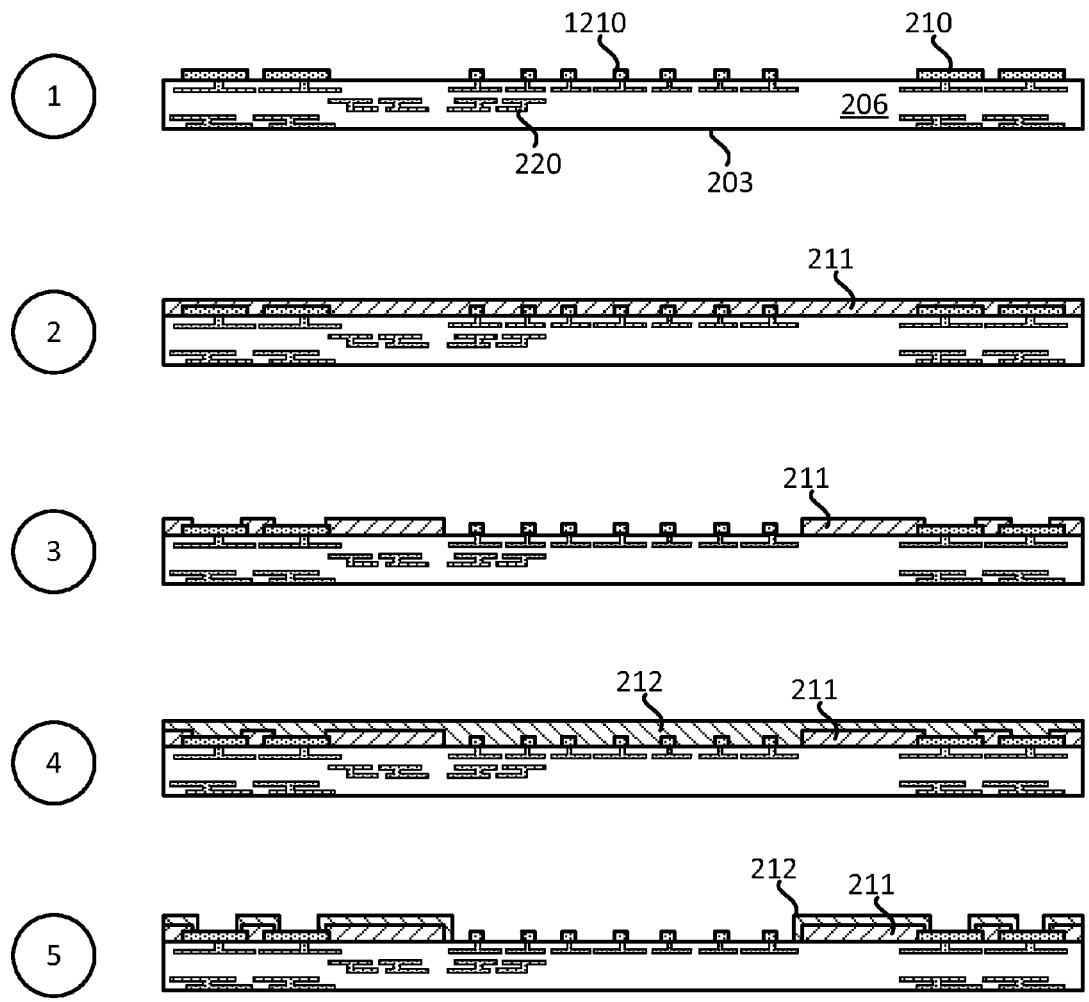
Figure 12B:
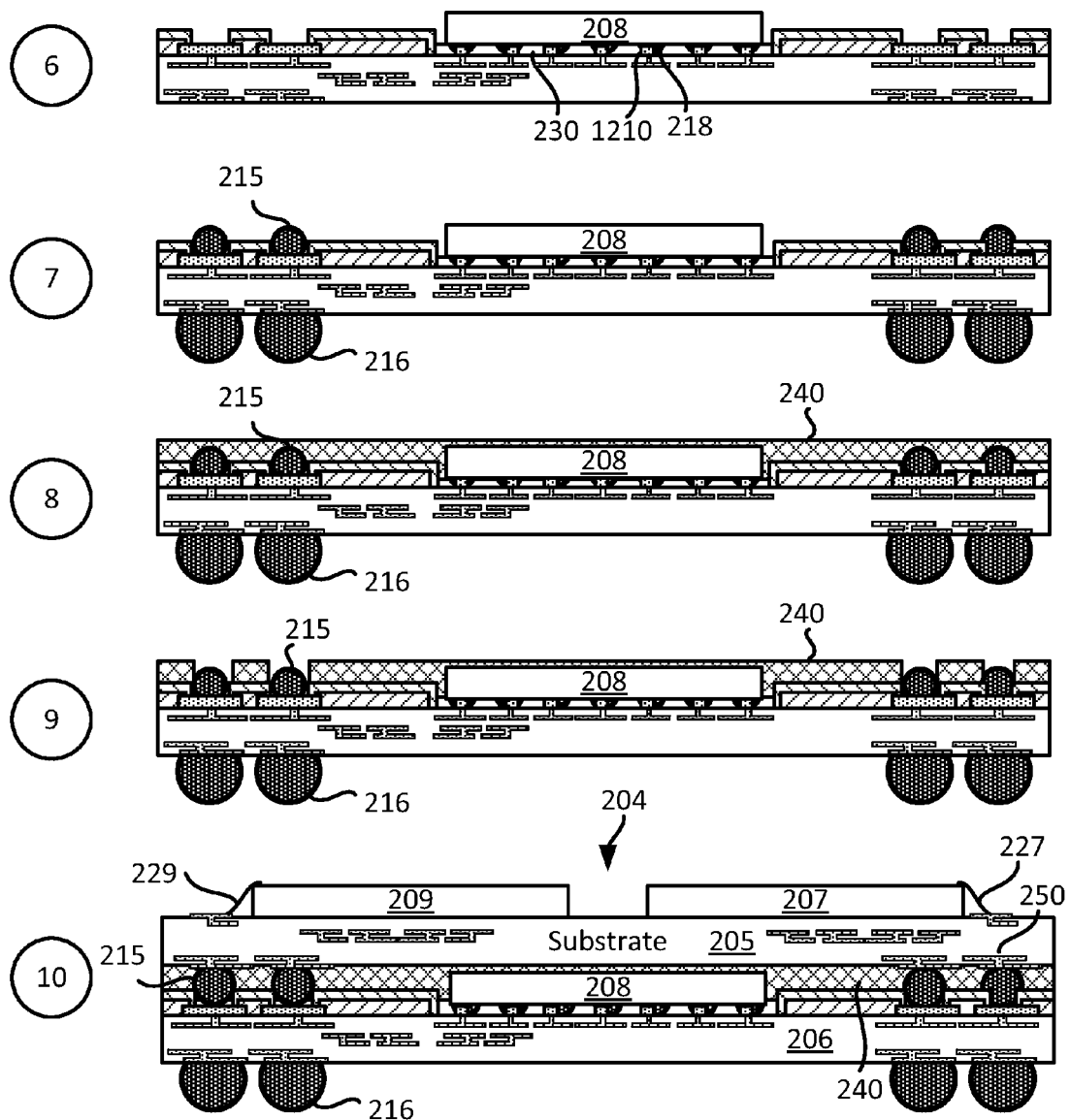

FIG. 12 (comprising FIG. 12A and FIG. 12B) illustrates an example of a sequence for fabricating a package on package (PoP) integrated device that includes several solder resist layers.

Figure 13A:
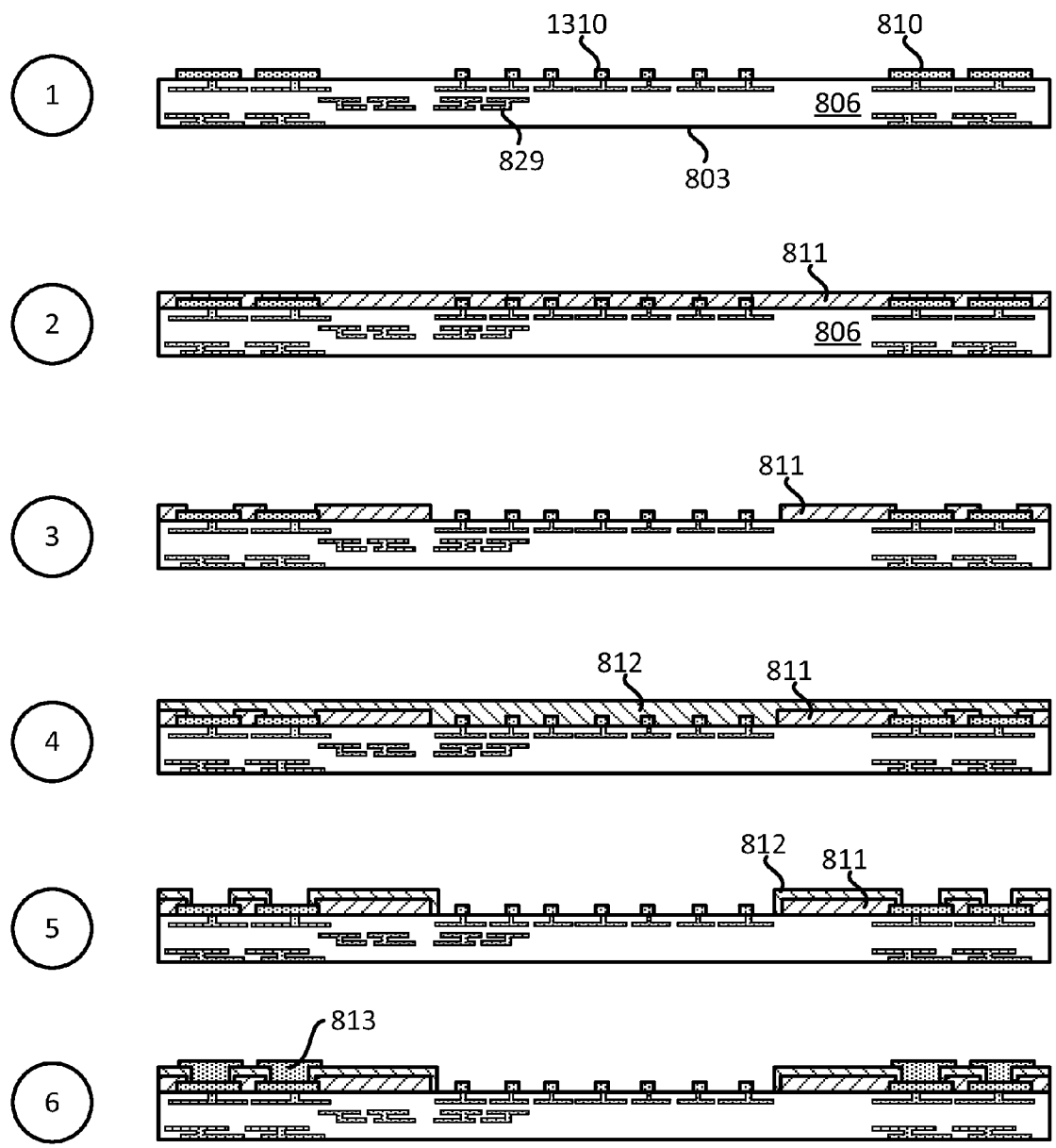
Figure 13B:
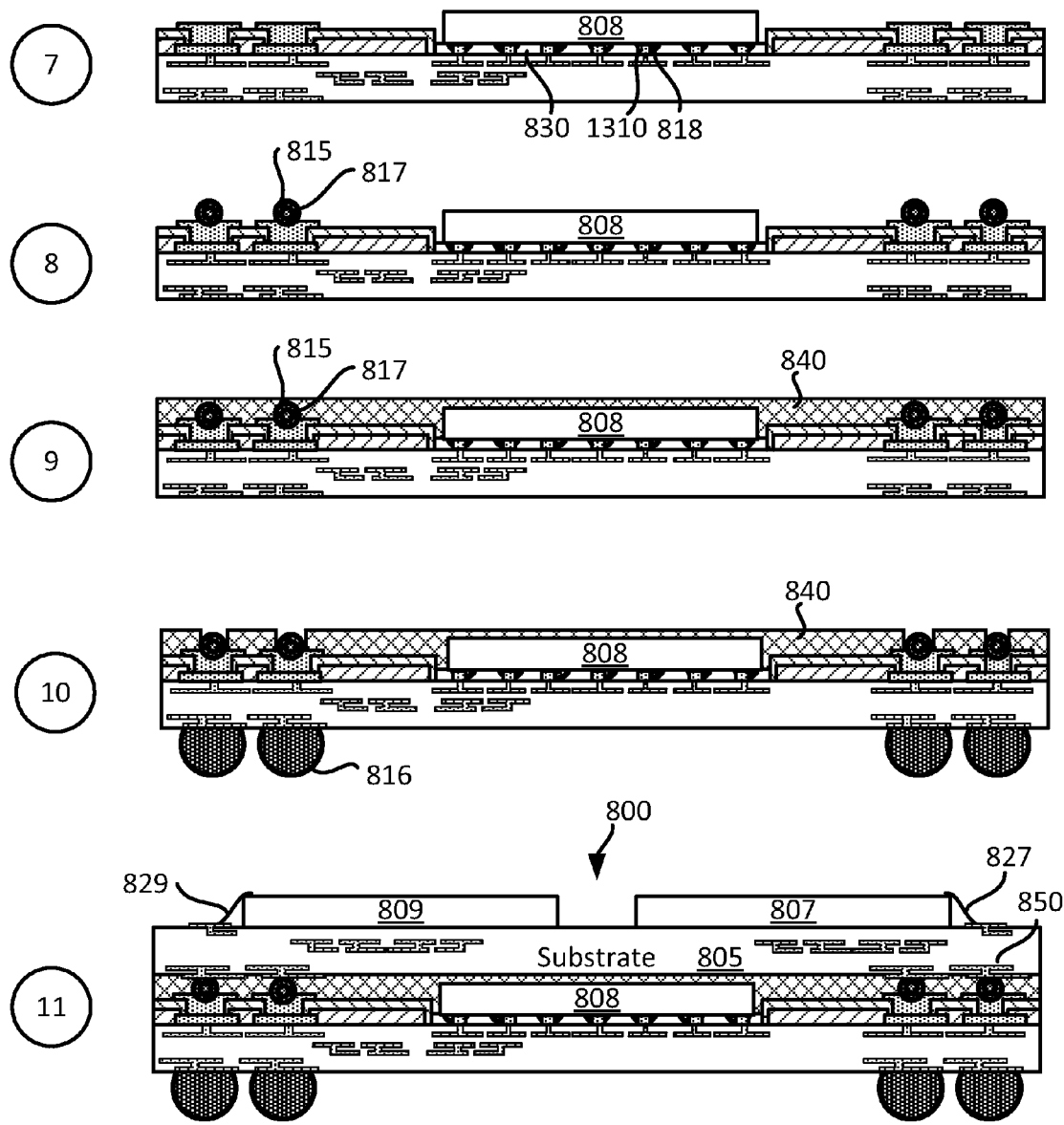

FIG. 13 (comprising FIG. 13A and FIG. 13B) illustrates another example of a sequence for fabricating a package on package (PoP) integrated device that includes several solder resist layers.

Figure 14:
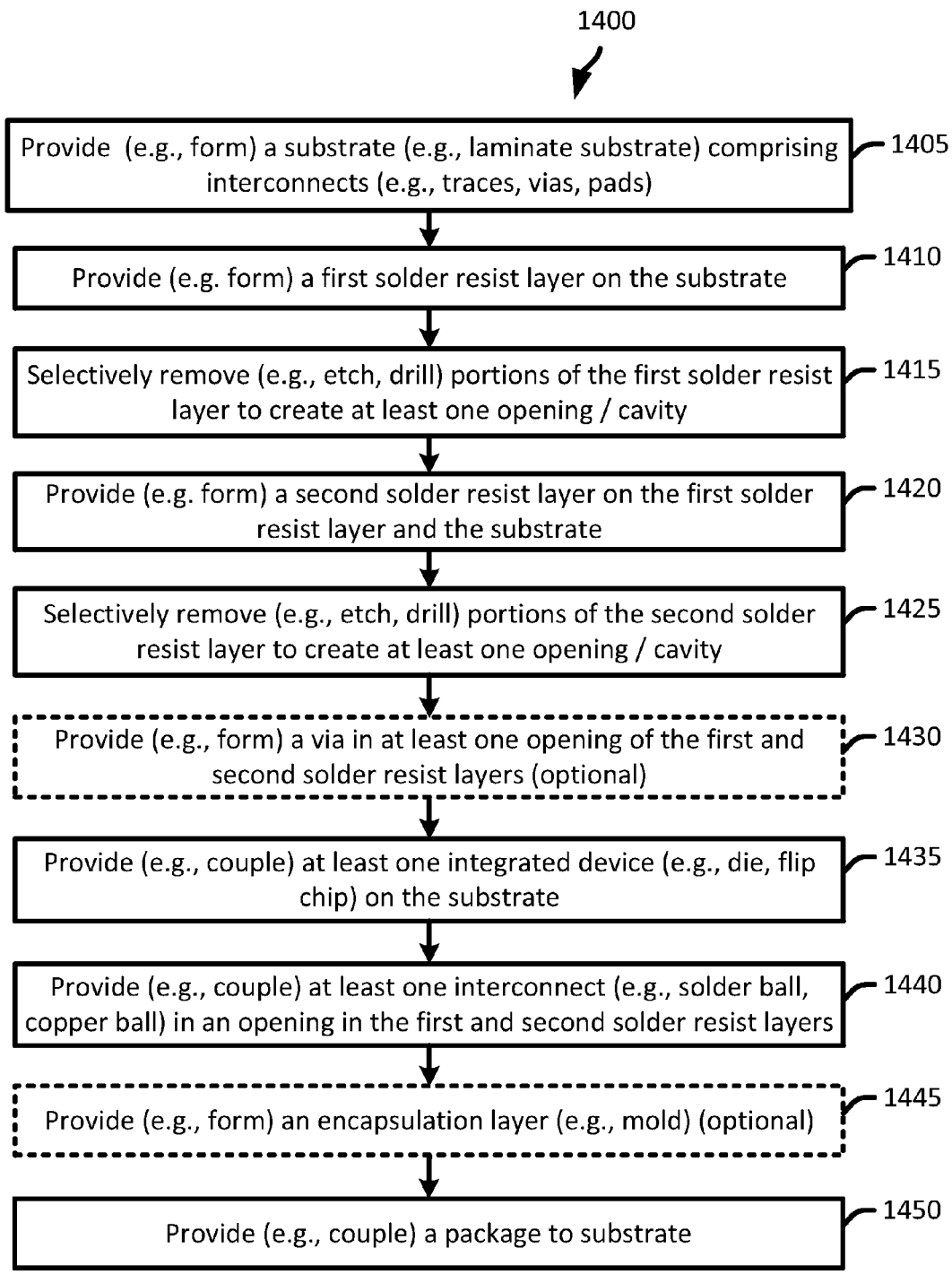

FIG. 14 illustrates an example of a flow diagram of a method for fabricating a package on package (PoP) integrated device that includes several solder resist layers.

Figure 15:
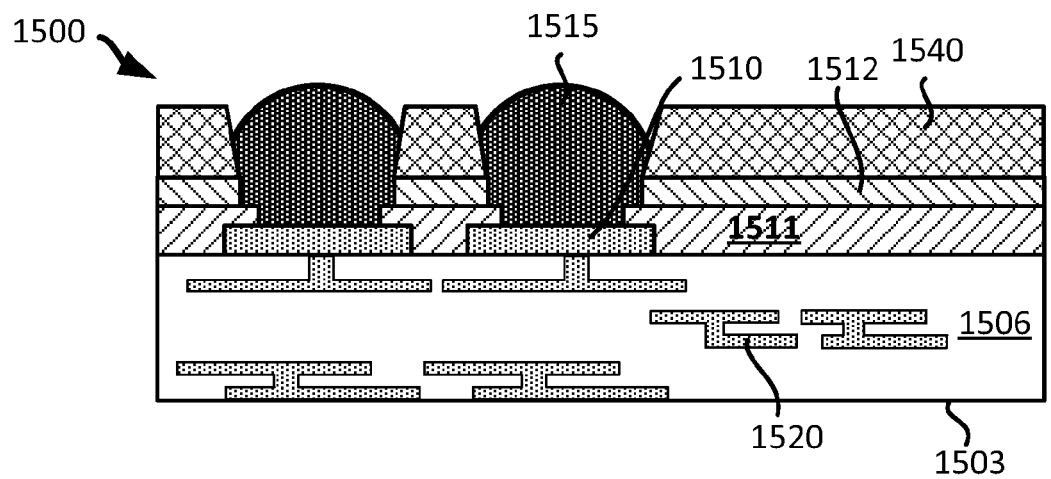

FIG. 15 illustrates an example of a close up view of package on package (PoP) integrated device that includes several staggered solder resist layers.

Figure 16:
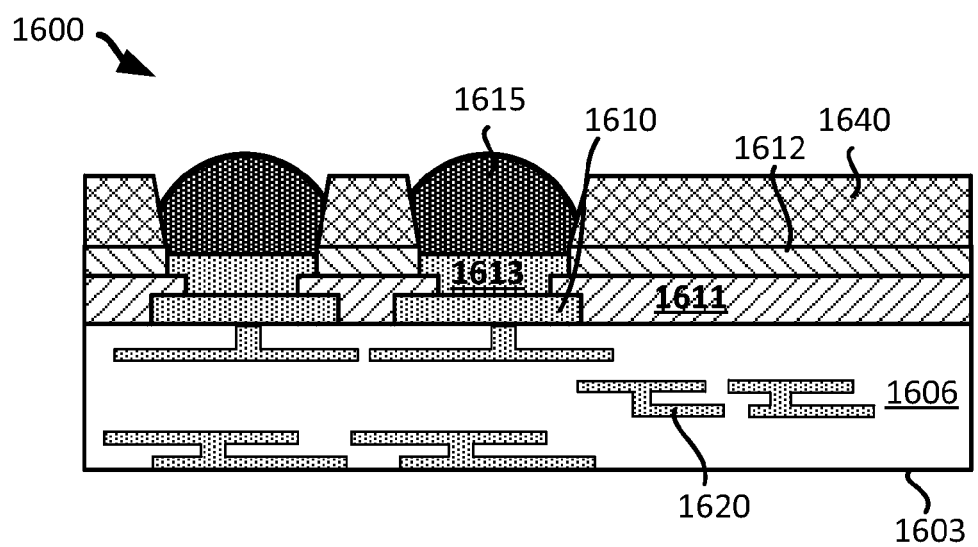

FIG. 16 illustrates an example of a close up view of package on package (PoP) integrated device that includes several staggered solder resist layers and interconnects in the solder resist layers.

Figure 17:
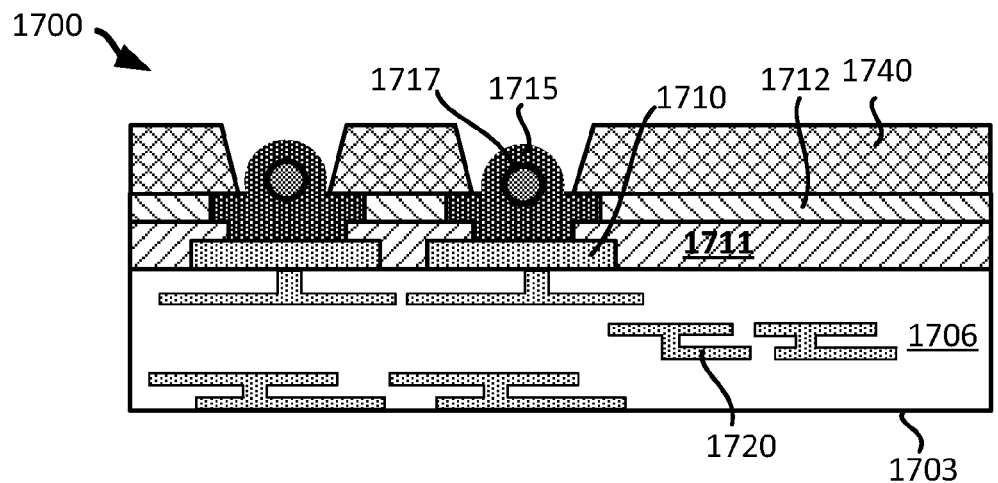

FIG. 17 illustrates another example of a close up view of package on package (PoP) integrated device that includes several staggered solder resist layers and interconnects in the solder resist layers.

Figure 18:
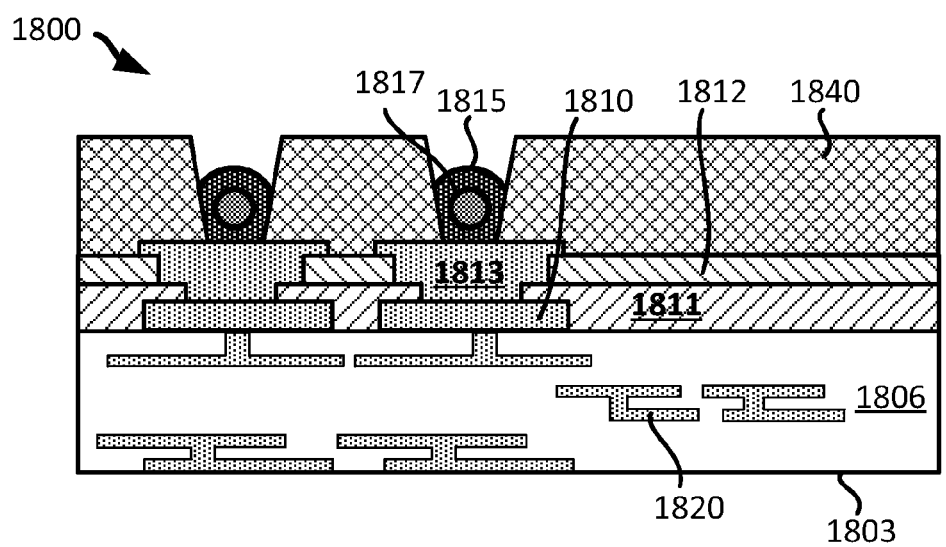

FIG. 18 illustrates an example of a close up view of package on package (PoP) integrated device that includes several staggered solder resist layers and interconnects in the solder resist layers, and interconnect balls.

Figure 19:
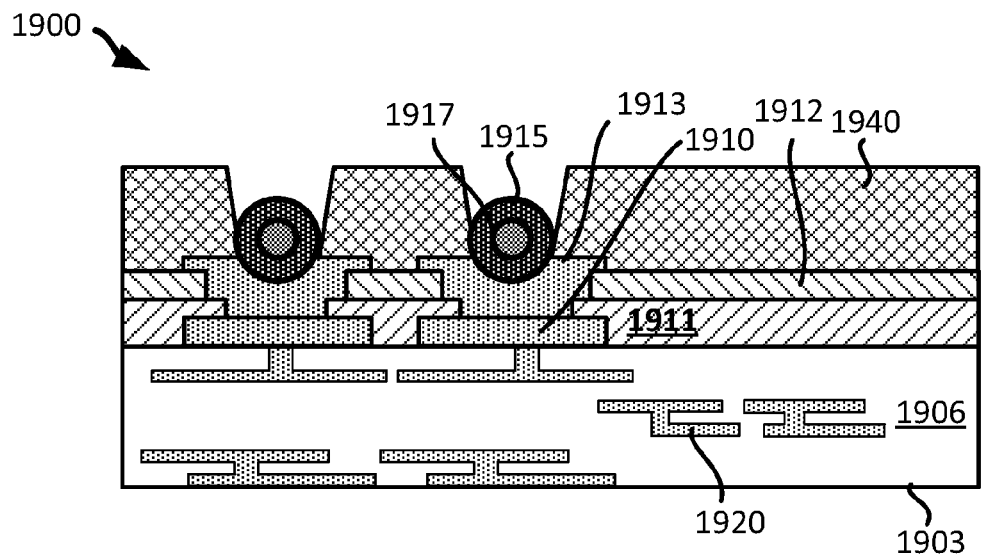

FIG. 19 illustrates an example of a close up view of package on package (PoP) integrated device that includes interconnects in the staggered solder resist layers, where the interconnects have a curved surface.

Figure 20:
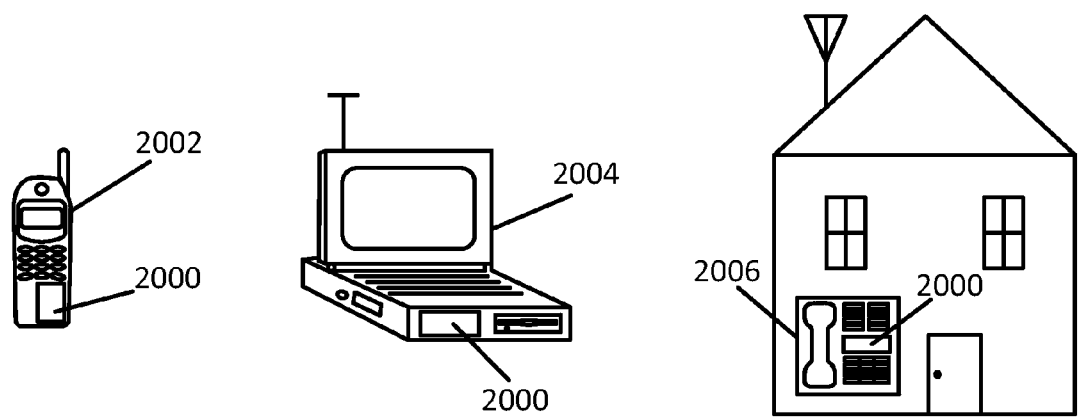

FIG. 20 illustrates various electronic devices that may integrate a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to an integrated device that includes a first substrate, a first solder resist layer coupled to the first substrate, a second solder resist layer coupled to the first solder resist layer, and an opening in the first and second solder resist layers, the opening comprising a sidewall completely covered with the second solder resist layer, where a sidewall of the second solder resist layer covers a sidewall of the first solder resist layer. In some implementations, the opening is at least partially filled with an electrically conductive material. The electrically conductive material includes one of solder and/or a plated interconnect. The integrated device includes a first interconnect coupled to the electrically conductive material. The the first interconnect is one of at least a solder, and/or an interconnect ball. In some implementations, the integrated device includes a pad coupled to the substrate, and a first interconnect coupled to the pad. The first interconnect is one of at least a solder, and/or an interconnect ball. In some implementations, the integrated device includes a third solder resist layer between the first solder resist layer and the second solder resist layer.

Terms and Definitions

An interconnect is an element or component that allows or facilitates an electrical connection between two points, elements and/or components. In some implementations, an interconnect may include a trace, a via, a pad, a pillar, and/or a solder ball. In some implementations, an interconnect is an electrically conductive material that provides an electrical path for a signal (e.g., data signal, ground signal, power signal). An interconnect may include more than one element/component.

Figure 1:
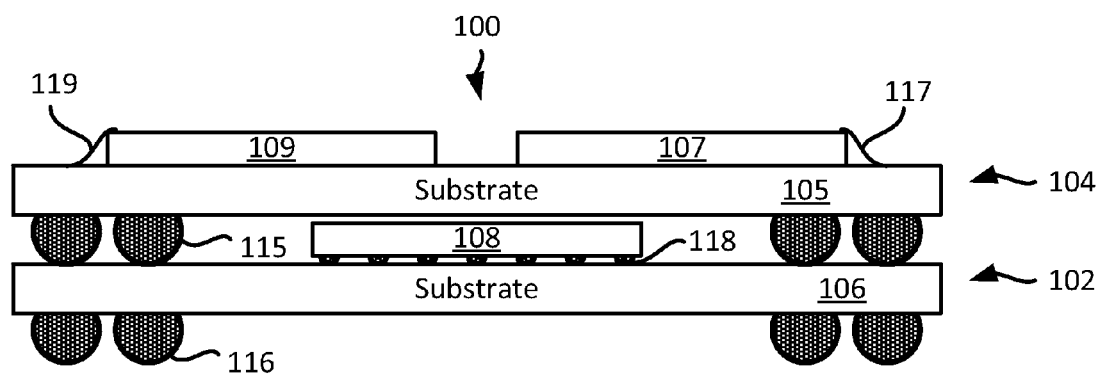
FIG. 1 illustrates a conventional package on package (PoP) integrated device.
Figure 2:
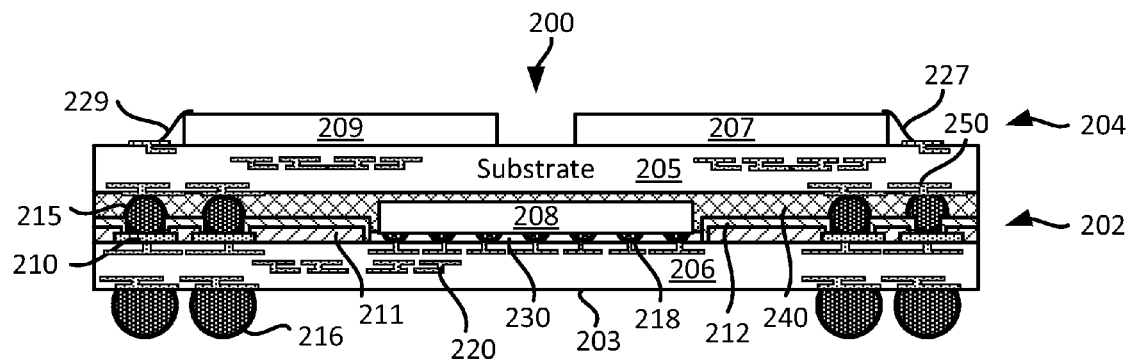
FIG. 2 illustrates an example of a package on package (PoP) integrated device that includes several solder resist layers.

Exemplary Package on Package (PoP) Integrated Device that Includes Several Solder Resist Layers FIG. 2 illustrates an exemplary package on package (PoP) integrated device 200 that includes several solder resist layers. As shown in FIG. 2, the integrated device 200 includes a first integrated device package 202 and a second integrated device package 204. The first package 202 includes a first substrate 203, a first die (e.g., chip) 208, a set of pads 210, a first solder resist layer 211, a second solder resist layer 212, a first set of solder balls 216, and an encapsulation layer 240. The first substrate 203 may include one or more dielectric layers 206. The first substrate 203 includes a set of interconnects 220. The set of interconnects 220 may include one of at least a trace, a via, and/or a pad. The encapsulation layer 240 may include one of at least a mold, and/or an epoxy fill.

The second package 204 includes a second substrate 205, a second die 207, a third die 209, a second set of solder balls 215, a first set of wire bonding 227, and a second set of wire bonding 229. The second substrate 205 may include one or more dielectric layers. The second substrate 205 includes a set of interconnects 250. The set of interconnects 250 may include one of at least a trace, a via, and/or a pad. The second package 204 is positioned above the first package 202.

The first die 208 is coupled to a first surface (e.g., top surface) of the first substrate 203 through a first set of interconnects 218. The first set of interconnects 218 may include one of at least solder balls, copper pillars, or combination thereof. An underfill 230 may also be provided (e.g., formed) between the first die 208 and the substrate 203. The first set of solder balls 216 is coupled to a second surface (e.g., bottom surface) of the first substrate 203. The set of interconnects 220 (e.g., traces, vias) may electrically connect to the first die 208 and/or the first set of solder balls 216.

The second die 207 and the third die 209 are coupled to a first surface (e.g., top surface) of the second substrate 205. The second die 207 is electrically coupled to the interconnects 250 (e.g., traces, vias) of the second substrate 205 through the first set of wire bonding 227. The third die 209 is electrically coupled to the interconnects 250 (e.g., traces, vias) of the second substrate 205 through the second set of wire bonding 229. The second set of solder balls 215 is coupled to a second surface (e.g., bottom surface) of the second substrate 205 and the set of pads 210.

Figure 3:
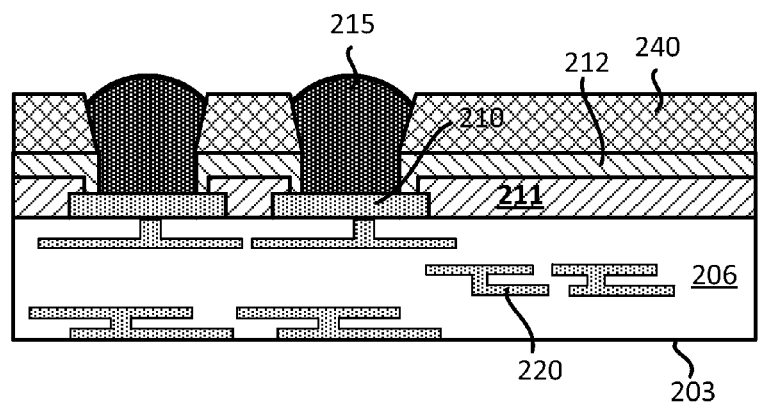
FIG. 3 illustrates an example of a close up view of package on package (PoP) integrated device that includes several solder resist layers.

FIG. 3 illustrates a close-up view of a portion of the integrated device 200 of FIG. 2. Specifically, FIG. 3 illustrates a close-up of a profile view of first package 202. As shown in FIG. 3, the first package 202 includes the substrate 203, the set of pads 210, the first solder resist layer 211, the second resist layer 212, the solder ball 215, and the set of interconnects 220. The substrate 203 may includes one or more dielectric layers 206. The set of interconnects 220 is located in the substrate 203, and provide one or more electrical paths in the substrate 203. The pad 210 is located on the surface of the substrate 203. The first solder resist layer 211 is located on the substrate 203. The second set of solder resist layer 212 is located on the first solder resist layer 211. Different implementations may use the same or different materials for the first and second solder resist layers 211 and 212. In some implementations, more than two solder resist layers may be provided (e.g., formed) on the substrate 203. FIG. 3 illustrates that the second solder resist layer 212 is formed on the first solder resist layer 211 such that the second solder resist layer 212 covers the sidewalls of the first solder resist layer 211. Thus, in some implementations, some or all of the sidewalls of the first solder resist layers are not exposed. The encapsulation layer 240 is located on the second solder resist layer 212. As shown in FIG. 3, there are openings in the encapsulation layer 240 over the solder ball 215. The solder ball 215 is an electrically conductive material.

In some implementations, the configuration shown in FIGS. 2-3 provides high density package-to-package interconnects (e.g., solder ball 215). In some implementations, these package-to-package interconnects may have a pitch of about 0.4 millimeters (mm) or less, which is substantially less than conventional package-on-package (PoP) devices. In some implementations, a pitch is defined as a center to center distance between two neighboring or adjacent interconnects.

Figure 4:
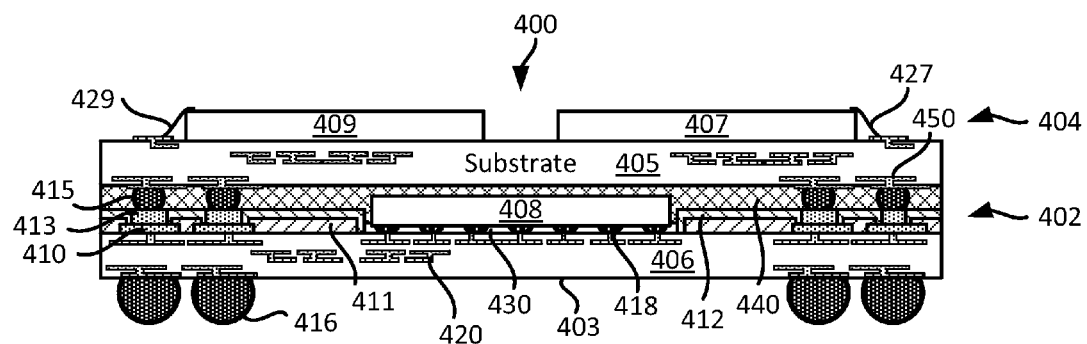
FIG. 4 illustrates an example of a package on package (PoP) integrated device that includes several solder resist layers and interconnects in the solder resist layers.

Exemplary Package on Package (PoP) Integrated Device that Includes Several Solder Resist Layers and through Solder Resist Openings FIG. 4 illustrates an exemplary package on package (PoP) integrated device 400 that includes several solder resist layers. As shown in FIG. 4, the integrated device 400 includes a first integrated device package 402 and a second integrated device package 404. The first package 402 includes a first substrate 403, a first die (e.g., chip) 408, a set of pads 410, a first solder resist layer 411, a second solder resist layer 412, a set of interconnects 413, a first set of solder balls 416, and an encapsulation layer 440. The first substrate 403 may include one or more dielectric layers 406. The first substrate 403 includes a set of interconnects 420. The set of interconnects 420 may include one of at least a trace, a via, and/or a pad. The set of pads 410 is coupled to the set of vias 413. The encapsulation layer 440 may include one of at least a mold, and/or an epoxy fill. The set of interconnects 413 may be a solder resist opening filled with an electrically conductive materials. For example, the set of interconnects 413 may be pillars.

The second package 404 includes a second substrate 405, a second die 407, a third die 409, a second set of solder balls 415, a first set of wire bonding 427, and a second set of wire bonding 429. The second substrate 405 may include one or more dielectric layers. The second substrate 405 includes a set of interconnects 450. The set of interconnects 450 may include one of at least a trace, a via, and/or a pad. The second package 404 is positioned above the first package 402.

The first die 408 is coupled to a first surface (e.g., top surface) of the first substrate 403 through a first set of interconnects 418. The first set of interconnects 418 may include one of at least solder balls, copper pillars, or combination thereof. An underfill 430 may also be provided (e.g., formed)

between the first die 408 and the substrate 403. The first set of solder balls 416 is coupled to a second surface (e.g., bottom surface) of the first substrate 403. The set of interconnects 420 (e.g., traces, vias) may electrically connect to the first die 408 and/or the first set of solder balls 416.

The second die 407 and the third die 409 are coupled to a first surface (e.g., top surface) of the second substrate 405. The second die 407 is electrically coupled to the interconnects 450 (e.g., traces, vias) of the second substrate 405 through the first set of wire bonding 427. The third die 409 is electrically coupled to the interconnects 450 (e.g., traces, vias) of the second substrate 405 through the second set of wire bonding 429. The second set of solder balls 415 is coupled to a second surface (e.g., bottom surface) of the second substrate 405 and the set of interconnects 413. The set of interconnects 413 and the solder balls 415 are electrically conductive materials.

Figure 5:
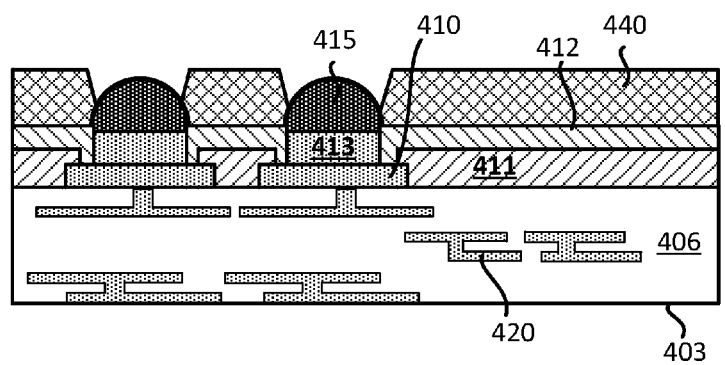
FIG. 5 illustrates an example of a close up view of package on package (PoP) integrated device that includes several solder resist layers and interconnects in the solder resist layers.

FIG. 5 illustrates a close-up view of a portion of the integrated device 400 of FIG. 4. Specifically, FIG. 5 illustrates a close-up of a profile view of first package 402. As shown in FIG. 5, the first package 402 includes the substrate 403, the set of pads 410, the first solder resist layer 411, the second resist layer 412, the set of interconnects 413, the solder ball 415, and the set of interconnects 420. The substrate 403 may includes one or more dielectric layers 406. The set of interconnects 420 is located in the substrate 403, and provide one or more electrical paths in the substrate 403. The pad 410 is located on the surface of the substrate 403. The interconnect 413 is coupled to the pad 410. The first solder resist layer 411 is located on the substrate 403. The second set of solder resist layer 412 is located on the first solder resist layer 411. Different implementations may use the same or different materials for the first and second solder resist layers 411 and 412. In some implementations, more than two solder resist layers may be provided (e.g., formed) on the substrate 403. FIG. 5 illustrates that the second solder resist layer 412 is formed on the first solder resist layer 411 such that the second solder resist layer 412 covers the sidewalls of the first solder resist layer 411. Thus, in some implementations, some or all of the sidewalls of the first solder resist layers are not exposed. The encapsulation layer 440 is located on the second solder resist layer 412. As shown in FIG. 5, there are openings in the encapsulation layer 440 over the solder ball 415.

In some implementations, the configuration shown in FIGS. 4-5 provides high density package-to-package interconnects (e.g., interconnects 413, solder ball 415). In some implementations, these package-to-package interconnects may have a pitch of about 0.4 millimeters (mm) or less, which is substantially less than conventional package-on-package (PoP) devices. In some implementations, a pitch is defined as a center to center distance between two neighboring or adjacent interconnects.

Figure 6:
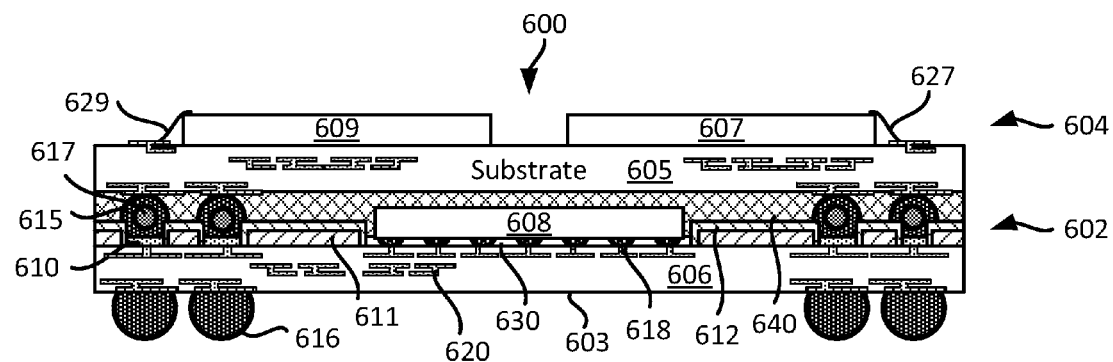
FIG. 6 illustrates another example of a package on package (PoP) integrated device that includes several solder resist layers and interconnects in the solder resist layers.

Exemplary Package on Package (PoP) Integrated Device that Includes Several Solder Resist Layers and Interconnect Balls FIG. 6 illustrates an exemplary package on package (PoP) integrated device 600 that includes several solder resist layers. As shown in FIG. 6, the integrated device 600 includes a first integrated device package 602 and a second integrated device package 604. The first package 602 includes a first substrate 603, a first die (e.g., chip) 608, a set of pads 610, a first solder resist layer 611, a second solder resist layer 612, a first set of solder 616, and an encapsulation layer 640. The first substrate 603 may include one or more dielectric layers 606. The first substrate 603 includes a set of interconnects 620. The set of interconnects 620 may include one of at least a trace, a via, and/or a pad. The encapsulation layer 640 may include one of at least a mold, and/or an epoxy fill.

The second package 604 includes a second substrate 605, a second die 607, a third die 609, a second set of solder 615, a set of interconnects 617, a first set of wire bonding 627, and a second set of wire bonding 629. The second substrate 605 may include one or more dielectric layers. The second substrate 605 includes a set of interconnects 650. The set of interconnects 650 may include one of at least a trace, a via, and/or a pad. The second package 604 is positioned above the first package 602. The set of interconnects 617 may include a metal interconnect (e.g., interconnect ball) that is located within the second set of solder 615. Different implementations may use different use different materials for the set of interconnects 617. The set of solder 615 and the set of interconnects 617 are electrically conductive materials.

The first die 608 is coupled to a first surface (e.g., top surface) of the first substrate 603 through a first set of interconnects 618. The first set of interconnects 618 may include one of at least solder balls, copper pillars, or combination thereof. An underfill 630 may also be provided (e.g., formed) between the first die 608 and the substrate 603. The first set of solder balls 616 is coupled to a second surface (e.g., bottom surface) of the first substrate 603. The set of interconnects 620 (e.g., traces, vias) may electrically connect to the first die 608 and/or the first set of solder balls 616.

The second die 607 and the third die 609 are coupled to a first surface (e.g., top surface) of the second substrate 605. The second die 607 is electrically coupled to the interconnects 650 (e.g., traces, vias) of the second substrate 605 through the first set of wire bonding 627. The third die 609 is electrically coupled to the interconnects 650 (e.g., traces, vias) of the second substrate 605 through the second set of wire bonding 629. The second set of solder 615 and the set of interconnect 617 are coupled to a second surface (e.g., bottom surface) of the second substrate 605 and the set of pads 610.

Figure 7:
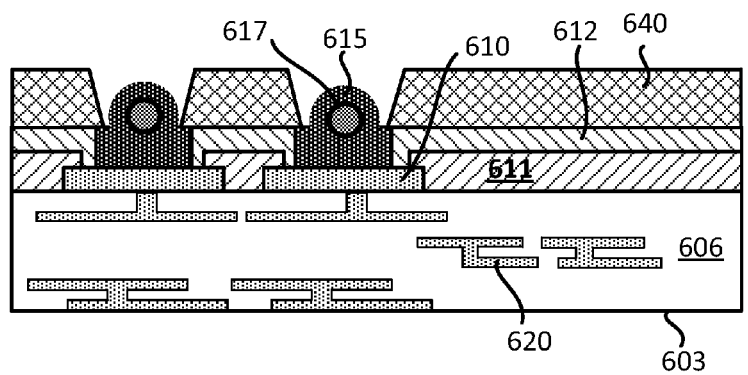
FIG. 7 illustrates another example of a close up view of package on package (PoP) integrated device that includes several solder resist layers and interconnects in the solder resist layers.

FIG. 7 illustrates a close-up view of a portion of the integrated device 600 of FIG. 6. Specifically, FIG. 7 illustrates a close-up of a profile view of first package 602. As shown in FIG. 7, the first package 602 includes the substrate 603, the set of pads 610, the first solder resist layer 611, the second resist layer 612, the solder 615, the interconnect 617 (e.g., interconnect ball) and the set of interconnects 620. The substrate 603 may includes one or more dielectric layers 606. The set of interconnects 620 is located in the substrate 603, and provide one or more electrical paths in the substrate 603. The pad 610 is located on the surface of the substrate 603. The first solder resist layer 611 is located on the substrate 603. The second set of solder resist layer 612 is located on the first solder resist layer 611. Different implementations may use the same or different materials for the first and second solder resist layers 611 and 612. In some implementations, more than two solder resist layers may be provided (e.g., formed) on the substrate 603. FIG. 7 illustrates that the second solder resist layer 612 is formed on the first solder resist layer 611 such that the second solder resist layer 612 covers the sidewalls of the first solder resist layer 611. Thus, in some implementations, some or all of the sidewalls of the first solder resist layers are not exposed. The encapsulation layer 240 is located on the second solder resist layer 612. As shown in FIG. 7, there are openings in the encapsulation layer 640 over the solder ball 615.

In some implementations, the configuration shown in FIGS. 6-7 provides high density package-to-package interconnects (e.g., interconnects 615 and 617). In some implementations, these package-to-package interconnects may have a pitch of about 0.4 millimeters (mm) or less, which is substantially less than conventional package-on-package (PoP) devices. In some implementations, a pitch is defined as a center to center distance between two neighboring or adjacent interconnects.

Figure 8:
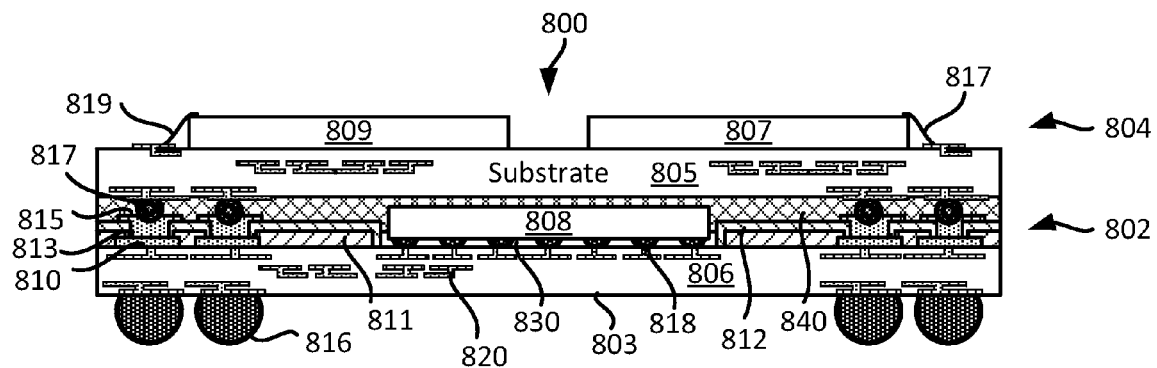
FIG. 8 illustrates an example of a package on package (PoP) integrated device that includes several solder resist layers, interconnects in the solder resist layers, and interconnect balls.

Exemplary Package on Package (PoP) Integrated Device that Includes Several Solder Resist Layers, through Solder Resist Vias, and Interconnect Balls FIG. 8 illustrates an exemplary package on package (PoP) integrated device 800 that includes several solder resist layers. As shown in FIG. 8, the integrated device 800 includes a first integrated device package 802 and a second integrated device package 804. The first package 802 includes a first substrate 803, a first die (e.g., chip) 808, a set of pads 810, a first solder resist layer 811, a second solder resist layer 812, a set of interconnects 813, a first set of solder 816, and an encapsulation layer 840. The first substrate 803 may include one or more dielectric layers 806. The first substrate 803 includes a set of interconnects 820. The set of interconnects 820 may include one of at least a trace, a via, and/or a pad. The encapsulation layer 840 may include one of at least a mold, and/or an epoxy fill.

The second package 804 includes a second substrate 805, a second die 807, a third die 809, a second set of solder 815, a set of interconnects 817, a first set of wire bonding 827, and a second set of wire bonding 829. The second substrate 805 may include one or more dielectric layers. The second substrate 805 includes a set of interconnects 850. The set of interconnects 850 may include one of at least a trace, a via, and/or a pad. The second package 804 is positioned above the first package 802. The set of interconnects 817 may include a metal interconnect (e.g., interconnect ball) that is located within the second set of solder 815. Different implementations may use different use different materials for the set of interconnects 817.

The first die 808 is coupled to a first surface (e.g., top surface) of the first substrate 803 through a first set of interconnects 818. The first set of interconnects 818 may include one of at least solder balls, copper pillars, or combination thereof. An underfill 830 may also be provided (e.g., formed) between the first die 808 and the substrate 803. The first set of solder balls 816 is coupled to a second surface (e.g., bottom surface) of the first substrate 803. The set of interconnects 820 (e.g., traces, vias) may electrically connect to the first die 808 and/or the first set of solder balls 816.

The second die 807 and the third die 809 are coupled to a first surface (e.g., top surface) of the second substrate 805. The second die 807 is electrically coupled to the interconnects 850 (e.g., traces, vias) of the second substrate 805 through the first set of wire bonding 827. The third die 809 is electrically coupled to the interconnects 850 (e.g., traces, vias) of the second substrate 805 through the second set of wire bonding 829. The second set of solder 815 and the set of interconnect 817 are coupled to a second surface (e.g., bottom surface) of the second substrate 805 and the set of interconnects 813. The set of interconnects 813 is coupled to the set of pads 810. The set of interconnects 813 may be pillars. The set of interconnects 813, the set of solder 815, and the set of interconnects 817 are electrically conductive materials.

Figure 9:
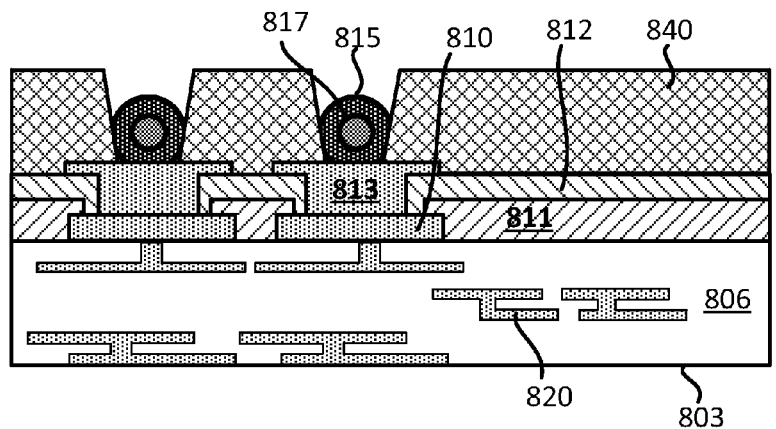
FIG. 9 illustrates an example of a close up view of package on package (PoP) integrated device that includes several solder resist layers and interconnects in the solder resist layers, and interconnect balls.

FIG. 9 illustrates a close-up view of a portion of the integrated device 800 of FIG. 8. Specifically, FIG. 9 illustrates a close-up of a profile view of first package 802. As shown in FIG. 9, the first package 802 includes the substrate 803, the set of pads 810, the first solder resist layer 811, the second resist layer 812, the interconnect 813, the solder 815, the interconnect 817 (e.g., interconnect ball) and the set of interconnects 820. The substrate 803 may includes one or more dielectric layers 806. The set of interconnects 820 is located in the substrate 803, and provide one or more electrical paths in the substrate 803. The pad 810 is located on the surface of the substrate 803. The interconnect 813 is coupled to the pad 810.

FIG. 9 illustrates that the first surface (e.g., top surface) of the via has a relatively flat surface. The first solder resist layer 811 is located on the substrate 803. The second set of solder resist layer 812 is located on the first solder resist layer 812. Different implementations may use the same or different materials for the first and second solder resist layers 811 and 812. In some implementations, more than two solder resist layers may be provided (e.g., formed) on the substrate 803. FIG. 9 illustrates that the second solder resist layer 812 is formed on the first solder resist layer 811 such that the second solder resist layer 812 covers the sidewalls of the first solder resist layer 811. Thus, in some implementations, some or all of the sidewalls of the first solder resist layers are not exposed. The encapsulation layer 840 is located on the second solder resist layer 812. As shown in FIG. 9, there are openings in the encapsulation layer 840 over the solder ball 815.

Figure 10:
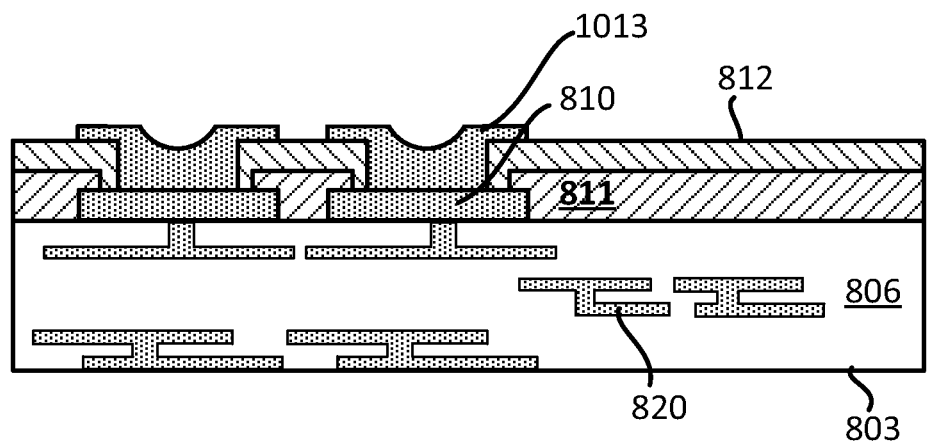
FIG. 10 illustrates an example of a close up view of package on package (PoP) integrated device that includes interconnects in the solder resist layers, where the interconnects have a curved surface.

FIG. 10 illustrates another close-up view of a portion of the integrated device 800 of FIG. 8. FIG. 10 is similar to FIG. 9, except that part of the first surface (e.g., top surface) of the interconnect 1013 has a non-flat surface (e.g., curved surface). In some implementations, the surface of the interconnect 1013 has a surface that is curved similarly to the shape of the solder 815 and the interconnect 817. The interconnect 1013 may be a pillar. The interconnect 1013, the set of solder 815, and the set of interconnects 817 are electrically conductive materials.

Figure 11:
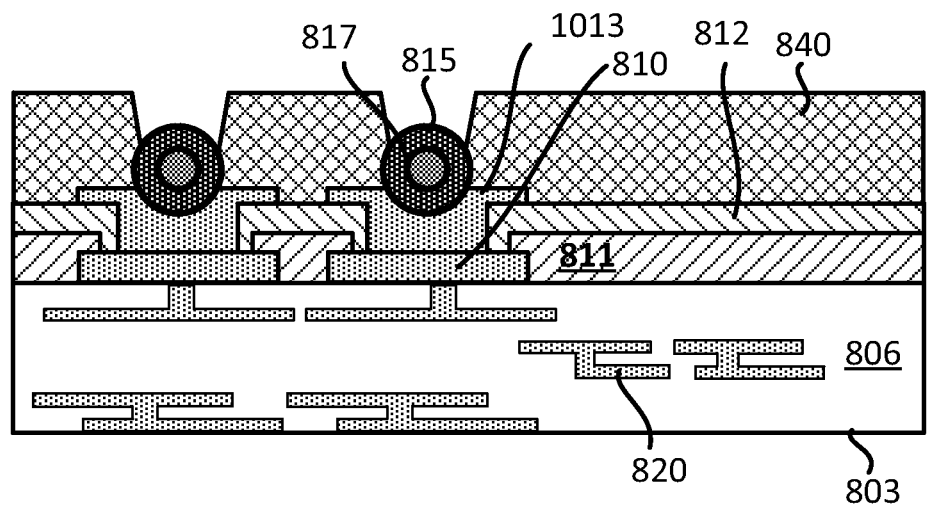
FIG. 11 illustrates an example of a close up view of package on package (PoP) integrated device that includes interconnects in the solder resist layers, where the interconnects have a curved surface.

FIG. 11 illustrates the substrate 803 that includes the via 1013, the solder 815, the interconnect 817, and the encapsulation layer 840.

In some implementations, the configuration shown in FIGS. 8-11 provide high density package-to-package interconnects (e.g., via 813, interconnects 815 and 817). In some implementations, these package-to-package interconnects may have a pitch of about 0.4 millimeters (mm) or less, which is substantially less than conventional package-on-package (PoP) devices. In some implementations, a pitch is defined as a center to center distance between two neighboring or adjacent interconnects.

Exemplary Sequence for Providing/Fabricating A Package on Package (PoP) Integrated Device Comprising Several Solder Resist Layers In some implementations, providing/fabricating a package-on-package (PoP) integrated device that includes several solder resist layers includes several processes. FIG. 12 (which includes FIGS. 12A-12B) illustrates an exemplary sequence for providing/fabricating a package-on-package integrated device. In some implementations, the sequence of FIGS. 12A-12B may be used to provide/fabricate the PoP integrated device of FIG. 2, and/or other PoP integrated devices described in the present disclosure. However, for the purpose of simplification, FIGS. 12A-12B will be described in the context of providing/fabricating the PoP integrated device of FIG. 2.

It should be noted that the sequence of FIGS. 12A-12B may combine one or more stages in order to simplify and/or clarify the sequence for providing a PoP integrated device. In some implementations, the order of the processes may be changed or modified.

Stage 1 of FIG. 12A, illustrates a state after a substrate 203 is provided. In some implementations, the substrate 203 is provided by a supplier. In some implementations, the substrate 203 is fabricated (e.g., formed). The substrate 203 may be a laminated substrate that includes one or more dielectric layers 206. As shown in stage 1, the substrate 203 includes a set of interconnects 220, a set of pads 210, and a set of pads

1210. The set of interconnects 220 may include one of at least a trace, a via, and/or a pad. The set of interconnects 220 are located within the substrate 203. The set of pads 210 and 1210 are located on a surface of the substrate 203. The set of interconnects 220, the set of pads 210, and the set of pads 1210 provide an electrical path for signals (e.g., data signal, power, ground). In some implementations, the set of pads 1210 is configured to couple to a die. In some implementations, the integrated devices 200, 400, 600, and/or 800 may include the set of pads 1210. However, the set of pads 1210 may not be visible in FIGS. 2, 4, 6 and/or 8 because the set of pads 1210 may be covered by a set of solder balls.

Stage 2 illustrates a state after a first solder resist layer 211 is provided (e.g., formed) on the substrate 203. Specifically, stage 2 illustrates a state after the first solder resist layer 211 is formed over a first surface of the substrate 203 and/or the set of pads 210. Different implementations may use different materials for the first solder resist layer 211.

Stage 3 illustrates a state after portions of the first solder resist layer 211 are removed. Different implementations may use different processes for removing portions of the first solder resist layer 211. In some implementations, portions of the first solder resist layer 211 are removed by using an etching process (e.g., photo etching process), and/or a drilling process (e.g., laser drilling process). As shown in stage 3, portions of the first solder resist layer 211 over the set of pads 210 and some of the set of interconnects 220 have been removed, leaving one or more openings and/or cavities over the set of pads 210 and some of the set of interconnects 220.

Stage 4 illustrates a state after a second solder resist layer 212 is provided (e.g., formed) on the first solder resist layer 211 and/or the substrate 203. Specifically, stage 4 illustrates a state after the second solder resist layer 212 is formed over the first solder resist layer 211, the first surface of the substrate 203 and/or the set of pads 210. Different implementations may use different materials for the first solder resist layer 212. In some implementations, the second solder resist layer 212 may be the same or different material as the first solder resist layer 211.

Stage 5 illustrates a state after portions of the second solder resist layer 212 are removed. Different implementations may use different processes for removing portions of the second solder resist layer 212. In some implementations, portions of the second solder resist layer 212 are removed by using an etching process (e.g., photo etching process), and/or a drilling process (e.g., laser drilling process). As shown in stage 5, portions of the second solder resist layer 212 over the set of pads 210 and some of the set of interconnects 220 have been removed, leaving one or more openings and/or cavities over the set of pads 210 and some of the set of interconnects 220. In some implementations, one or more openings/cavities are formed in such a way that the sidewalls of the openings/cavities are defined by the second solder resist layer 212. In such instances, the first solder resist layer 211 is not exposed since they are covered by the second solder resist layer 212. However, in some implementations, the removing of the second solder resist layer 212 may be done in such a way so that part of the first solder resist layer 211 is exposed.

In some implementations, additional solder resist layers may be provided (e.g., formed) and/or selectively removed as needed. Thus, in some implementations, more than two solder resist layers may be provided on the substrate 203.

Stage 6 of FIG. 12B, illustrates a state after an integrated device 208 (e.g., die, flip chip) is provided and coupled to the substrate 203. As shown at stage 6, the integrated device 208 is coupled to the substrate 203 through the set of interconnects 218. Different implementations may use different processes for coupling the integrated device to the substrate 203. Examples of processes include thermal compression, and/or mass reflow. The set of interconnects 218 may include one of at least solder balls, and/or pillars. In some implementations, the set of interconnects 218 is coupled to the set of interconnects 1210 (e.g., pads). An underfill 230 is also provided between the integrated device 208 and the substrate 203. The underfill 230 encapsulates the set of interconnects 218. The integrated device 208 is electrically coupled to the set of interconnects 220 through the set of interconnects 218 and the set of interconnects 1210.

Stage 7 illustrates a state after a set of solder balls 216 is provided on the substrate 203. Specifically, stage 7 illustrates a state after the set of solder balls 216 is coupled to the set of interconnects 220 through a second surface (e.g., bottom surface) of the substrate 203.

Stage 8 illustrates a state after an encapsulation layer 240 is provided and coupled to the second solder resist layer 212. In some implementations, the encapsulation layer 240 encapsulates the integrated device 208 and the solder balls 215.

Stage 9 illustrates a state after portions of the encapsulation layer 240 are removed. Different implementations may use different processes to remove portions of the encapsulation layer 240. Examples of processes to remove portions of the encapsulation include laser ablation and/or etching (e.g., photo etching).

Stage 10 illustrates a state after the second package 204 is provided and coupled to the substrate 203. As shown at stage 8, the second package 204 includes the second substrate 205, the second die 207, the third die 209, the second set of solder balls 215, the first set of wire bonding 227, and the second set of wire bonding 229. The second substrate 205 may include one or more dielectric layers. The second substrate 205 includes a set of interconnects 250. The set of interconnects 250 may include one of at least a trace, a via, and/or a pad. The second set of solder balls 215 is positioned in the openings of the first and second solder resist layers 211 and 212, over the set of pads 210.

Exemplary Sequence for Providing/Fabricating a Package on Package (PoP) Integrated Device Comprising Several Solder Resist Layers In some implementations, providing/fabricating a package-on-package (PoP) integrated device that includes several solder resist layers includes several processes. FIG. 13 (which includes FIGS. 13A-13B) illustrates an exemplary sequence for providing/fabricating a package-on-package integrated device. In some implementations, the sequence of FIGS. 13A-13B may be used to provide/fabricate the PoP integrated device of FIG. 8, and/or other PoP integrated devices described in the present disclosure. However, for the purpose of simplification, FIGS. 13A-13B will be described in the context of providing/fabricating the PoP integrated device of FIG. 8.

It should be noted that the sequence of FIGS. 13A-13B may combine one or more stages in order to simplify and/or clarify the sequence for providing a PoP integrated device. In some implementations, the order of the processes may be changed or modified.

Stage 1 of FIG. 13A, illustrates a state after a substrate 803 is provided. In some implementations, the substrate 803 is provided by a supplier. In some implementations, the substrate 803 is fabricated (e.g., formed). The substrate 803 may be a laminated substrate that includes one or more dielectric layers 806. As shown in stage 1, the substrate 803 includes a set of interconnects 820, a set of pads 810, and a set of pads 1310. The set of interconnects 820 may include one of at least a trace, a via, and/or a pad. The set of interconnects 820 are located within the substrate 803. The set of pads 810 and the set of pads 1310 are located on a surface of the substrate 803. The set of interconnects 820, the set of pads 810, and the set of pads 1310 provide an electrical path for signals (e.g., data signal, power, ground).

In some implementations, the integrated devices 200, 400, 600, and/or 800 may include the set of pads 1310. However, the set of pads 1310 may not be visible in FIGS. 2, 4, 6 and/or 8 because the set of pads 1310 may be covered by a set of solder balls.

Stage 2 illustrates a state after a first solder resist layer 811 is provided (e.g., formed) on the substrate 803. Specifically, stage 2 illustrates a state after the first solder resist layer 811 is formed over a first surface of the substrate 803 and/or the set of pads 810. Different implementations may use different materials for the first solder resist layer 811.

Stage 3 illustrates a state after portions of the first solder resist layer 811 are removed. Different implementations may use different processes for removing portions of the first solder resist layer 811. In some implementations, portions of the first solder resist layer 811 are removed by using an etching process (e.g., photo etching process), and/or a drilling process (e.g., laser drilling process). As shown in stage 3, portions of the first solder resist layer 811 over the set of pads 810 and some of the set of interconnects 820 have been removed, leaving one or more openings and/or cavities over the set of pads 810 and some of the set of interconnects 820.

Stage 4 illustrates a state after a second solder resist layer 812 is provided (e.g., formed) on the first solder resist layer 811 and/or the substrate 803. Specifically, stage 4 illustrates a state after the second solder resist layer 812 is formed over the first solder resist layer 811, the first surface of the substrate 803 and/or the set of pads 810. Different implementations may use different materials for the first solder resist layer 812. In some implementations, the second solder resist layer 812 may be the same or different material as the first solder resist layer 811.

Stage 5 illustrates a state after portions of the second solder resist layer 812 are removed. Different implementations may use different processes for removing portions of the second solder resist layer 812. In some implementations, portions of the second solder resist layer 812 are removed by using an etching process (e.g., photo etching process), and/or a drilling process (e.g., laser drilling process). As shown in stage 5, portions of the second solder resist layer 812 over the set of pads 810 and some of the set of interconnects 820 have been removed, leaving one or more openings and/or cavities over the set of pads 810 and some of the set of interconnects 820. In some implementations, one or more openings/cavities are formed in such a way that the sidewalls of the openings/cavities are defined by the second solder resist layer 812. In such instances, the first solder resist layer 811 is not exposed since they are covered by the second solder resist layer 812. However, in some implementations, the removing of the second solder resist layer 812 may be done in such a way so that part of the first solder resist layer 811 is exposed.

In some implementations, additional solder resist layers may be provided (e.g., formed) and/or selectively removed as needed. Thus, in some implementations, more than two solder resist layers may be provided on the substrate 803.

Stage 6 illustrates a state after one or more interconnects 813 (e.g., pillars) are provided (e.g., formed) in one or more openings of the first and second solder resist layers 811 and/or 812. As shown at stage 6, interconnects 813 are formed over the set of pads 210. Thus, the interconnects 813 are coupled to the set of pads 210. Different implementations may use different processes to provide the interconnects 813. In some implementations, a plating process is used to form the interconnects 813 in the openings/cavities. In some implementations, the vias may include a first metal layer and a second metal layer. In some implementations, a first metal layer is provided (e.g., plated) and then a second metal layer is provided (e.g., plated) over the first metal layer. In some implementations, the first metal layer is a seed layer. The first surface (e.g., top surface) of the set of interconnects 813 may have a substantially flat surface or a curved surface (as shown in FIGS. 9 and 10).

Stage 7 of FIG. 13B, illustrates a state after an integrated device 808 (e.g., die, flip chip) is provided and coupled to the substrate 803. As shown at stage 7, the integrated device 808 is coupled to the substrate 803 through the set of interconnects 818. Different implementations may use different processes for coupling the integrated device to the substrate 203. Examples of processes include thermal compression, and/or mass reflow. The set of interconnects 818 may include one of at least solder balls, and/or pillars. In some implementations, the set of interconnects 818 is coupled to the set of interconnects 1310 (e.g., pads). An underfill 830 is also provided between the integrated device 808 and the substrate 803. The underfill 830 encapsulates the set of interconnects 818. The integrated device 808 is electrically coupled to the set of interconnects 820 through the set of interconnects 818 and the set of interconnects 1310.

Stage 8 illustrates a state after the set of solder 815 and the set of interconnects 817 are provided on the set of interconnects 813. The set of interconnects 817 may include a metal interconnect (e.g., interconnect ball) that is located within the second set of solder 815. Different implementations may use different materials for the set of interconnects 817. The set of interconnects 813 may be pillars. The set of interconnects 813, the set of solder 815, and the set of interconnects 817 are electrically conductive materials.

Stage 9 illustrates a state after an encapsulation layer 840 is provided and coupled to the second solder resist layer 812. In some implementations, the encapsulation layer 840 encapsulates the integrated device 808, the solder 815 and the interconnects 817.

Stage 10 illustrates a state after portions of the encapsulation layer 840 are removed. Different implementations may use different processes to remove portions of the encapsulation layer 840. Examples of processes to remove portions of the encapsulation include laser ablation and/or etching (e.g., photo etching).

Stage 10 also illustrates a state after a set of solder balls 816 is provided on the substrate 803. Specifically, stage 10 illustrates a state after the set of solder balls 816 is coupled to the set of interconnects 820 through a second surface (e.g., bottom surface) of the substrate 803.

Stage 11 illustrates a state after the second package 804 is provided and coupled to the substrate 803. As shown at stage 8, the second package 804 includes the second substrate 805, the second die 807, the third die 809, the first set of wire bonding 827, and the second set of wire bonding 829. The second substrate 805 may include one or more dielectric layers. The second substrate 805 includes a set of interconnects 850. The set of interconnects 850 may include one of at least a trace, a via, and/or a pad. The set of solder 815 and the set of interconnects 817 may be coupled to the set of interconnects 850.

Exemplary Flow Diagram of a Method for Providing/Fabricating a Package on Package (PoP) Integrated Device Comprising Several Solder Resist Layers In some implementations, providing/fabricating a package-on-package (PoP) integrated device that includes several solder resist layers includes several processes. FIG. 14 illustrates an exemplary flow diagram of a method for providing/fabricating an integrated device that includes several solder resist layers. In some implementations, the flow diagram of of FIG. 14 may be used to provide/fabricate the integrated device of FIG. 2, 4, 6, 8, and/or other integrated devices described in the present disclosure.

It should be noted that the sequence of FIG. 14 may combine one or more processes in order to simplify and/or clarify the sequence for providing an integrated device. In some implementations, the order of the processes may be changed or modified.

The method provides (at 1405) a substrate (e.g., substrate 803). In some implementations, the substrate is provided by a supplier. In some implementations, the substrate is fabricated (e.g., formed). The substrate may be a laminated substrate that includes one or more dielectric layers. The substrate may include a set of interconnects and/or a set of pads. The set of interconnects may include one of at least a trace, a via, and/or a pad. The set of interconnects are located within the substrate. The set of pads are located on a surface of the substrate. The set of interconnects and the set of pads provide an electrical path for signals (e.g., data signal, power, ground).

The method provides (at 1410) a first solder resist layer (e.g., solder resist layer 811) is provided on the substrate. Different implementations may use different materials for the first solder resist layer.

The method selectively removes (at 1415) portions of the first solder resist layer. Different implementations may use different processes for removing portions of the first solder resist layer. In some implementations, portions of the first solder resist layer are removed by using an etching process (e.g., photo etching process), and/or a drilling process (e.g., laser drilling process). In some implementations, portions of the first solder resist layer over the set of pads and some of the set of interconnects are removed, leaving one or more openings and/or cavities over the set of pads and some of the set of interconnects.

The method provides (at 1420) a second solder resist layer (e.g., a second solder resist layer 812) on the first solder resist layer and/or the substrate. Different implementations may use different materials for the first solder resist layer. In some implementations, the second solder resist layer may be the same or different material as the first solder resist layer.

The method then selectively removes (at 1420) portions of the second solder resist layer. Different implementations may use different processes for removing portions of the second solder resist layer. In some implementations, portions of the second solder resist layer are removed by using an etching process (e.g., photo etching process), and/or a drilling process (e.g., laser drilling process). In some implementations, portions of the second solder resist layer over the set of pads 810 and some of the set of interconnects 820 are removed, leaving one or more openings and/or cavities over the set of pads and some of the set of interconnects. In some implementations, one or more openings/cavities are formed in such a way that the sidewalls of the openings/cavities are defined by the second solder resist layer. In such instances, the first solder resist layer is not exposed since they are covered by the second solder resist layer. However, in some implementations, the removing of the second solder resist layer may be done in such a way so that part of the first solder resist layer is exposed.

In some implementations, the method may provide additional solder resist layers and/or selectively removed portions of the solder resist layer as needed. Thus, in some implementations, more than two solder resist layers may be provided on the substrate.

The method may optionally provide (at 1430) one or more vias (e.g., vias 813) in one or more openings of the first and second solder resist layers. Different implementations may use different processes to provide the vias. In some implementations, a plating process is used to form the vias in the openings/cavities. In some implementations, the vias may include a first metal layer and a second metal layer. In some implementations, a first metal layer is provided (e.g., plated) and then a second metal layer is provided (e.g., plated) over the first metal layer. In some implementations, the first metal layer is a seed layer. The first surface (e.g., top surface) of the set of vias 813 may have a substantially flat surface or a curved surface (as shown in FIGS. 9 and 10). In some implementations, the vias may include solder, as shown in FIG. 7.

The method provides (at 1435) an integrated device (e.g., die, flip chip) to the substrate. The integrated device is coupled to the substrate through the set of interconnects (e.g., interconnect 818). Different implementations may use different processes for coupling the integrated device to the substrate. Examples of processes include thermal compression, and/or mass reflow. The set of interconnects may include one of at least solder balls, and/or pillars. An underfill (e.g., underfill 830) is also provided between the integrated device and the substrate. The underfill encapsulates the set of interconnects.

The method then provides (at 1440) a set of interconnects. The set of interconnects may be configured to electrically couple two packages together. Different implementations may use different use different materials for the set of interconnects. Examples of interconnects includes solder balls, solder, interconnect balls, copper balls. In some implementations, the set of interconnects is coupled to the via or the pads on the substrate.

The method optionally provides (at 1445) an encapsulation layer (e.g., encapsulation layer 840) and coupled to a second solder resist layer. In some implementations, the encapsulation layer encapsulates the integrated device (e.g., die), and the interconnects. In some implementations, providing the encapsulation layer includes selectively removing portions of the encapsulation layer. Different implementations may use different processes to remove portions of the encapsulation layer. Examples of processes to remove portions of the encapsulation include laser ablation and/or etching (e.g., photo etching).

The method then provides (at 1450) a second package (e.g., second package 804) and coupled to the substrate (e.g., substrate 803). In some implementations, the second package may include the second substrate 805, the second die 807, the third die 809, the first set of wire bonding 827, and the second set of wire bonding 829. The second substrate 805 may also include one or more dielectric layers. The second substrate 805 may further include a set of interconnects 850. The set of interconnects 850 may include one of at least a trace, a via, and/or a pad. The set of solder 815 and the set of interconnects 817 may be coupled to the set of interconnects 850.

Exemplary Package on Package (PoP) Integrated Device that Includes Several Staggered Solder Resist Layers and through Solder Resist Openings FIG. 15 illustrates a close-up of a profile view of a package 1500 that includes a substrate 1503, a set of pads 1510, a first solder resist layer 1511, a second resist layer 1512, a solder ball 1515, a set of interconnects 1520, and an encapsulation layer 1540. The substrate 1503 may includes one or more dielectric layers 1506. The set of interconnects 1520 is located in the substrate 1503, and provide one or more electrical paths in the substrate 1503. The pad 1510 is located on the surface of the substrate 1503. The first solder resist layer 1511 is located on the substrate 1503. The second set of solder resist layer 1512 is located on the first solder resist layer 1511. Different implementations may use the same or different materials for the first and second solder resist layers 1511 and 1512. In some implementations, more than two solder resist layers may be provided (e.g., formed) on the substrate 1503.

FIG. 15 illustrates that the second solder resist layer 1512 is formed on the first solder resist layer 1511 such that the second solder resist layer 1512 is staggered or offset from the first solder resist layer 1511. In some implementations, this results in one or more openings of the first and second solder resist layers 1511-1512 having a staggered shape (e.g., inverted pyramid shape). These openings may be filled with one or more electrically conductive materials (e.g., metal, solder). The encapsulation layer 1540 is located on the second solder resist layer 1512. As shown in FIG. 15, there are openings in the encapsulation layer 1540 over the solder ball 1515. The solder ball 1515 is an electrically conductive material.

FIG. 16 illustrates a close-up of a profile view of a first package 1600. As shown in FIG. 16, the first package 1600 includes a substrate 1603, a set of pads 1610, a first solder resist layer 1611, a second resist layer 1612, a set of interconnects 1613, a solder ball 1615, a set of interconnects 1620, and an encapsulation layer 1640. The substrate 1603 may includes one or more dielectric layers 1606. The set of interconnects 1620 is located in the substrate 1603, and provide one or more electrical paths in the substrate 1603. The pad 1610 is located on the surface of the substrate 1603. The interconnect 1613 is coupled to the pad 1610. The first solder resist layer 1611 is located on the substrate 1603. The second set of solder resist layer 1612 is located on the first solder resist layer 1611. Different implementations may use the same or different materials for the first and second solder resist layers 1611 and 1612. In some implementations, more than two solder resist layers may be provided (e.g., formed) on the substrate 1603.

FIG. 16 illustrates that the second solder resist layer 1612 is formed on the first solder resist layer 1611 such that the second solder resist layer 1612 is staggered or offset from the first solder resist layer 1611. In some implementations, this results in one or more openings of the first and second solder resist layers 1611-1612 having a staggered shape (e.g., inverted pyramid shape). These openings may be filled with one or more electrically conductive materials (e.g., metal, solder). The encapsulation layer 1640 is located on the second solder resist layer 1612. As shown in FIG. 16, there are openings in the encapsulation layer 1640 over the solder ball 1615.

FIG. 17 illustrates a close-up of a profile view of a first package 1700. As shown in FIG. 17, the first package 1700 includes a substrate 1703, a set of pads 1710, a first solder resist layer 1711, a second resist layer 1712, a solder 1715, an interconnect 1717, a set of interconnects 1720, and an encapsulation layer 1740. The substrate 1703 may includes one or more dielectric layers 1706. The set of interconnects 1720 is located in the substrate 1703, and provide one or more electrical paths in the substrate 1703. The pad 1710 is located on the surface of the substrate 1703. The first solder resist layer 1711 is located on the substrate 1703. The second set of solder resist layer 1712 is located on the first solder resist layer 1711. Different implementations may use the same or different materials for the first and second solder resist layers 1711 and 1712. In some implementations, more than two solder resist layers may be provided (e.g., formed) on the substrate 1703.

FIG. 17 illustrates that the second solder resist layer 1712 is formed on the first solder resist layer 1711 such that the second solder resist layer 1712 is staggered or offset from the first solder resist layer 1711. In some implementations, this results in one or more openings of the first and second solder resist layers 1711-1712 having a staggered shape (e.g., inverted pyramid shape). These openings may be filled with one or more electrically conductive materials (e.g., metal, solder). The encapsulation layer 1740 is located on the second solder resist layer 1712. As shown in FIG. 17, there are openings in the encapsulation layer 1740 over the solder ball 1715.

FIG. 18 illustrates a close-up of a profile view of a first package 1800. As shown in FIG. 18, the first package 1800 includes a substrate 1803, a set of pads 1810, a first solder resist layer 1811, a second resist layer 1812, a set of interconnects 1813, a set of interconnect 1813, a solder ball 1815, a set of interconnects 1820, and an encapsulation layer 1840. The substrate 1803 may includes one or more dielectric layers 1806. The set of interconnects 1820 is located in the substrate 1803, and provide one or more electrical paths in the substrate 1803. The pad 1810 is located on the surface of the substrate 1803. The interconnect 1813 is coupled to the pad 1810. The first solder resist layer 1811 is located on the substrate 1803. The second set of solder resist layer 1812 is located on the first solder resist layer 1811. Different implementations may use the same or different materials for the first and second solder resist layers 1811 and 1812. In some implementations, more than two solder resist layers may be provided (e.g., formed) on the substrate 1803.

FIG. 18 illustrates that the second solder resist layer 1812 is formed on the first solder resist layer 1811 such that the second solder resist layer 1812 is staggered or offset from the first solder resist layer 1811. In some implementations, this results in one or more openings of the first and second solder resist layers 1511-512 having a staggered shape (e.g., inverted pyramid shape). These openings may be filled with one or more electrically conductive materials (e.g., metal, solder). The encapsulation layer 1840 is located on the second solder resist layer 1812. As shown in FIG. 18, there are openings in the encapsulation layer 1840 over the solder ball 1815.

FIG. 19 illustrates a close-up of a profile view of a first package 1900. As shown in FIG. 19, the first package 1900 includes a substrate 1903, a set of pads 1910, a first solder resist layer 1911, a second resist layer 1912, a set of interconnects 1913, a set of interconnect 1913, a solder ball 1915, a set of interconnects 1920, and an encapsulation layer 1940. The substrate 1903 may includes one or more dielectric layers 1906. The set of interconnects 1920 is located in the substrate 1903, and provide one or more electrical paths in the substrate 1903. The pad 1910 is located on the surface of the substrate 1903. The interconnect 1913 is coupled to the pad 1910. A surface (e.g., top surface) of the interconnect 1913 has a curved surface. The first solder resist layer 1911 is located on the substrate 1903. The second set of solder resist layer 1912 is located on the first solder resist layer 1911. Different implementations may use the same or different materials for the first and second solder resist layers 1911 and 1912. In some implementations, more than two solder resist layers may be provided (e.g., formed) on the substrate 1903.

FIG. 19 illustrates that the second solder resist layer 1912 is formed on the first solder resist layer 1911 such that the second solder resist layer 1912 is staggered or offset from the first solder resist layer 1911. In some implementations, this results in one or more openings of the first and second solder resist layers 1511-512 having a staggered shape (e.g., inverted pyramid shape). These openings may be filled with one or more electrically conductive materials (e.g., metal, solder). The encapsulation layer 1940 is located on the second solder resist layer 1912. As shown in FIG. 19, there are openings in the encapsulation layer 1940 over the solder ball 1915.

In some implementations, the configurations shown in FIGS. 15-19 provide high density package-to-package interconnects (e.g., solder ball 1515). In some implementations, these package-to-package interconnects may have a pitch of about 0.4 millimeters (mm) or less, which is substantially less than conventional package-on-package (PoP) devices. In some implementations, a pitch is defined as a center to center distance between two neighboring or adjacent interconnects.

Exemplary Electronic Devices

FIG. 20 illustrates various electronic devices that may be integrated with any of the aforementioned integrated device, semiconductor device, integrated circuit, die, interposer, package or package-on-package (PoP). For example, a mobile telephone 2002, a laptop computer 2004, and a fixed location terminal 2006 may include an integrated device 2000 as described herein. The integrated device 2000 may be, for example, any of the integrated circuits, dice, packages, package-on-packages described herein. The devices 2002, 2004, 2006 illustrated in FIG. 20 are merely exemplary. Other electronic devices may also feature the integrated device 2000 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12A-12B, 13A-13B, 14, 15, 16, 17, 18, 19, and/or 20 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12A-12B, 13A-13B, 14, 15, 16, 17, 18, 19, and/or 20 and its corresponding description in the present disclosure is not limited to dies and/or ICs. In some implementations, FIGS. 2, 3, 4, 5, 6, 7, 8, 9, 10, 11, 12A-12B, 13A-13B, 14, 15, 16, 17, 18, 19, and/or 20 and its corresponding description may be used to manufacture, create, provide, and/or produce integrated devices. In some implementations, an integrated device may include a die, a die package, an integrated circuit (IC), a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
    a first substrate;
    a first solder resist layer coupled to the first substrate;
    a second solder resist layer coupled to the first solder resist layer;
    an opening in the first and second solder resist layers exposing a first sidewall of the first solder resist layer and a second sidewall of the second solder resist layer, wherein the second solder resist layer covers the first sidewall of the first solder resist layer;
    an electrically conductive material aligned with the opening; and
    a first interconnect distinct from the electrically conductive material and located within the electrically conductive material.

2. The integrated device of claim 1, wherein the opening is at least partially filled with the electrically conductive material.

3. The integrated device of claim 2, wherein the electrically conductive material includes solder.

4. The integrated device of claim 1 further comprising a second interconnect at least partially within the opening and coupled to the electrically conductive material.

5. The integrated device of claim 4, wherein the second interconnect is a pillar.

6. The integrated device of claim 4, wherein the second interconnect has a curved surface configured to receive at least a portion of the electrically conductive material containing the first interconnect.

7. The integrated device of claim 1 further comprising:
    a pad coupled to the first substrate and to the electrically conductive material.

8. The integrated device of claim 1, wherein the first interconnect is an interconnect ball.

9. The integrated device of claim 1, further comprising a third solder resist layer between the first solder resist layer and the second solder resist layer.

10. The integrated device of claim 1, wherein the integrated device is one of at least a package and/or package on package (POP) device.

11. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

12. A method for fabricating an integrated device, comprising:
    forming a first substrate;

forming a first solder resist layer on the first substrate;
forming a second solder resist layer on the first solder resist layer;
forming an opening in the first and second solder resist layers exposing a first sidewall of the first solder resist layer and a second sidewall of the second solder resist layer, wherein the second solder resist layer covers the first sidewall of the first solder resist layer;
forming an electrically conductive material aligned with the opening; and
forming a first interconnect distinct from the electrically conductive material and located within the electrically conductive material.

13. The method of claim 12, wherein forming the electrically conductive material includes forming the electrically conductive material at least partially in the opening.

14. The method of claim 13, wherein the electrically conductive material includes solder.

15. The method of claim 12 further comprising providing a second interconnect at least partially within the opening and coupled the electrically conductive material.

16. The method of claim 15, wherein the second interconnect is a pillar.

17. The method of claim 15, wherein forming the second interconnect further includes forming the second interconnect with a curved surface configured to receive at least a portion of the electrically conductive material containing the first interconnect.

18. The method of claim 12 further comprising:
forming a pad on the first substrate, wherein the pad is coupled to the electrically conductive material.

19. The method of claim 12, wherein the first interconnect is an interconnect ball.

20. The method of claim 12, further comprising forming a third solder resist layer between the first solder resist layer and the second solder resist layer.

21. The method of claim 12, wherein the integrated device is one of at least a package and/or package on package (POP) device.

22. The method of claim 12, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *